(12) United States Patent
Hsiao et al.

(10) Patent No.: US 11,387,199 B2
(45) Date of Patent: Jul. 12, 2022

(54) GALLIUM ARSENIDE RADIO FREQUENCY CIRCUIT AND MILLIMETER WAVE FRONT-END MODULE

(71) Applicant: WIN Semiconductors Corp., Tao Yuan (TW)

(72) Inventors: Shao-Cheng Hsiao, Taoyuan (TW);
Chih-Wen Huang, Taoyuan (TW);
Jui-Chieh Chiu, Taoyuan (TW);
Po-Kie Tseng, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 365 days.

(21) Appl. No.: 16/790,755

(22) Filed: Feb. 14, 2020

(65) Prior Publication Data

US 2021/0257319 A1     Aug. 19, 2021

(51) Int. Cl.
*H01L 23/66*     (2006.01)
*H01L 29/66*     (2006.01)

(52) U.S. Cl.
CPC ........ *H01L 23/66* (2013.01); *H01L 29/66242* (2013.01); *H01L 29/66462* (2013.01); *H01L 2223/6677* (2013.01); *H01L 2924/01031* (2013.01); *H01L 2924/01033* (2013.01)

(58) Field of Classification Search
CPC .............. H01L 23/66; H01L 29/66242; H01L 29/66462; H01L 2223/6677; H01L 2924/01031; H01L 2924/01033
See application file for complete search history.

(56) References Cited

U.S. PATENT DOCUMENTS

| | | | | |
|---|---|---|---|---|
| 4,791,421 | A | * | 12/1988 | Morse ...................... H01Q 3/26 342/368 |
| 5,554,865 | A | * | 9/1996 | Larson ............... H01Q 21/0025 257/195 |
| 2004/0232982 | A1 | | 11/2004 | Ichitsubo |
| 2006/0164163 | A1 | * | 7/2006 | Apel ..................... H03F 1/0277 330/129 |
| 2010/0271119 | A1 | * | 10/2010 | Karoui ...................... H03F 1/32 329/345 |
| 2011/0102074 | A1 | | 5/2011 | Buer |
| 2012/0062330 | A1 | * | 3/2012 | Penn ........................ H04B 1/40 29/846 |

(Continued)

OTHER PUBLICATIONS

Saturne, Microsystems Based on Wide Band Gap, Materials for Future Space Transmitting, Ultra Wideband Receiving Systems, A. Ziaei, THALES Research & Technology, https://hobbydocbox.com/Radio/99228834-Saturne-microsystems-based-on-wide-band-gap-materials-for-future-space-transmitting-ultra-wideband-receiving-systems.html, Sep. 2, 2019.

*Primary Examiner* — Peter Bradford
(74) *Attorney, Agent, or Firm* — Winston Hsu

(57) ABSTRACT

A gallium arsenide (GaAs) radio frequency (RF) circuit is disclosed. The GaAs RF circuit includes a power amplifier and a low noise amplifier; a first transmit/receive (TR) switch, coupled to the power amplifier and the low noise amplifier, wherein the first TR switch is fabricated by a pHEMT (Pseudomorphic High Electron Mobility Transistor) process; and a first active phase shifter, coupled to the power amplifier or the low noise amplifier, wherein the first active phase shifter is fabricated by an HBT (Heterojunction Bipolar Transistor) process; wherein the GaAs RF circuit is formed within a GaAs die.

16 Claims, 6 Drawing Sheets

(56) References Cited

U.S. PATENT DOCUMENTS

| | | | |
|---|---|---|---|
| 2013/0194017 A1* | 8/2013 | Staudinger | H03F 1/3282 |
| | | | 327/231 |
| 2014/0094129 A1 | 4/2014 | Chang | |
| 2015/0222319 A1* | 8/2015 | Imbornone | H04B 1/0475 |
| | | | 455/82 |
| 2016/0241208 A1 | 8/2016 | Lehtola | |
| 2017/0250725 A1* | 8/2017 | Wei | H04B 1/40 |
| 2019/0089402 A1 | 3/2019 | Zihir | |
| 2019/0312330 A1* | 10/2019 | Madsen | H01Q 21/06 |
| 2020/0013774 A1* | 1/2020 | Lin | H01L 27/0605 |
| 2021/0391321 A1* | 12/2021 | Dutta | H01L 21/8248 |

\* cited by examiner

United States Patent US 11,387,199 B2

GALLIUM ARSENIDE RADIO FREQUENCY CIRCUIT AND MILLIMETER WAVE FRONT-END MODULE

BACKGROUND OF THE INVENTION

1. Field of the Invention

The present application relates to a gallium arsenide (GaAs) radio frequency (RF) circuit and a millimeter wave front-end module, and more particularly, to a GaAs RF circuit and a millimeter wave front-end module with reduced circuit area.

2. Description of the Prior Art

The demand of 5G communication system using millimeter wave to communicate is growing. In the millimeter wave communication system, a wavelength is in a scale of millimeter, e.g., 10 millimeter (mm) for a 30 GHz operating frequency.

Note that, in a multiple-antenna system, a plurality of antennas is half-wavelength spaced, which means that a spacing between the antennas may be only 5 mm. Furthermore, to reduce circuit area or to reduce routing/line path length, the front-end circuit, e.g., an RF (radio frequency) chain, may be physically disposed between the antennas. However, some existing fabrication processes, e.g., pure pHEMT (Pseudomorphic High Electron Mobility Transistor) process or pure HBT (Heterojunction Bipolar Transistor), would not able to produce die comprising RF chain(s) which can be fitted into the constrained size limited by the half wavelength.

Therefore, how to further reduce circuit area is a significant objective in the field.

SUMMARY OF THE INVENTION

It is therefore a primary objective of the present application to provide a GaAs RF circuit and a millimeter wave front-end module with reduced circuit area, to improve over disadvantages of the prior art.

An embodiment of the present application discloses a gallium arsenide (GaAs) radio frequency (RF) circuit. The GaAs RF circuit comprises a power amplifier and a low noise amplifier; a first transmit/receive (TR) switch, coupled to the power amplifier and the low noise amplifier, wherein the first TR switch is fabricated by a pHEMT (Pseudomorphic High Electron Mobility Transistor) process; and a first active phase shifter, coupled to the power amplifier or the low noise amplifier, wherein the first active phase shifter is fabricated by an HBT (Heterojunction Bipolar Transistor) process; wherein the GaAs RF circuit is formed within a GaAs die.

An embodiment of the present application discloses a millimeter wave front-end module. The millimeter wave front-end module comprises a plurality of antennas, wherein a spacing between the plurality of antennas is less than or equal to a half of a wavelength corresponding to an operating frequency at which the millimeter wave front-end module operates; and a gallium arsenide (GaAs) die, disposed between the plurality of antennas, comprising a plurality of GaAs radio frequency (RF) circuit, each GaAs RF circuit comprising a power amplifier and a low noise amplifier; a first transmit/receive (TR) switch, coupled to the power amplifier and the low noise amplifier, wherein the first TR switch is fabricated by a pHEMT (Pseudomorphic High Electron Mobility Transistor) process; and a first active phase shifter, coupled to the power amplifier or the low noise amplifier, wherein the first active phase shifter is fabricated by an HBT (Heterojunction Bipolar Transistor) process; wherein a GaAs RF circuit is coupled to an antenna.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
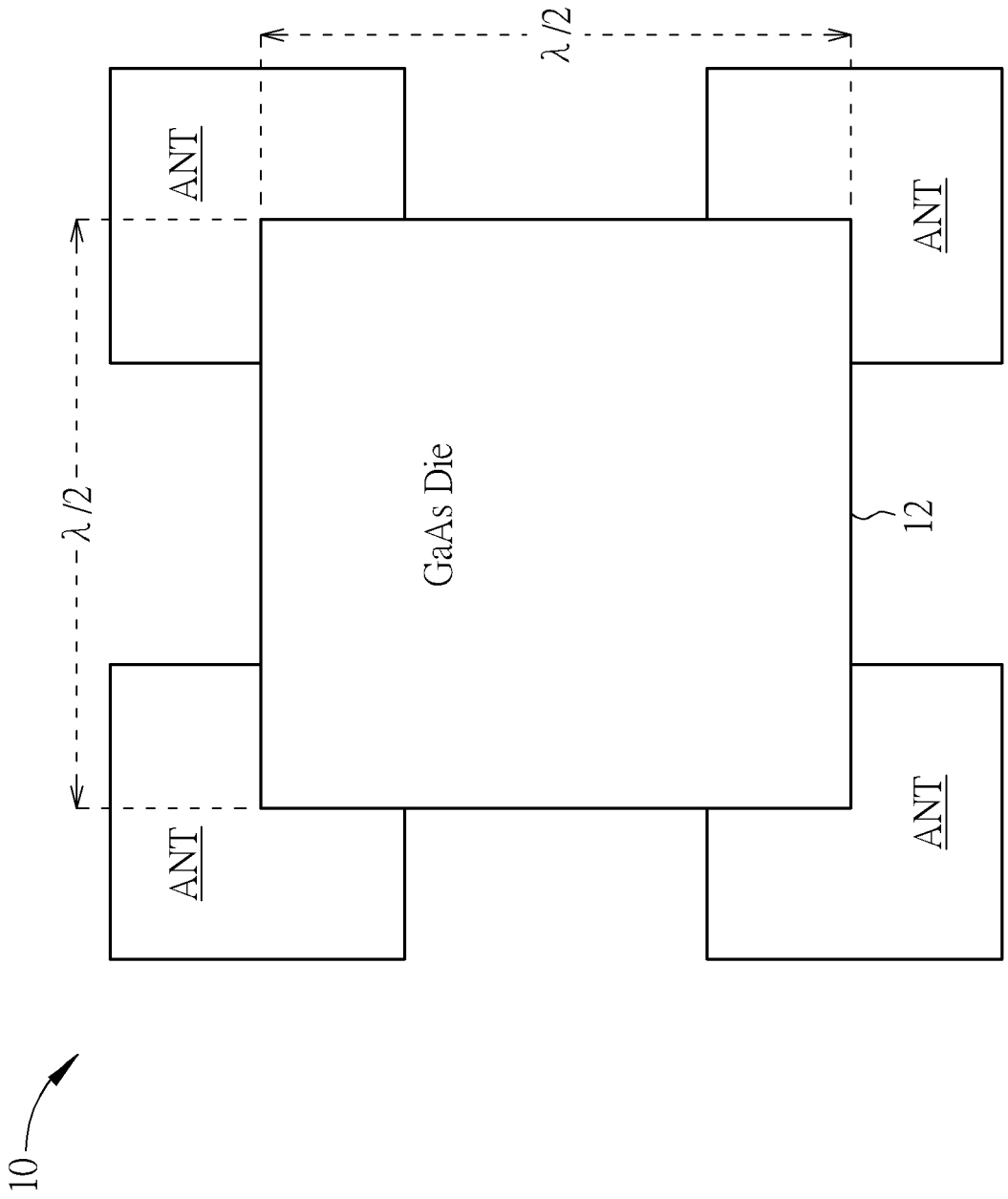
FIG. 1 is a schematic diagram of a top view a millimeter wave front-end module according to an embodiment of the present application.
Figure 2:
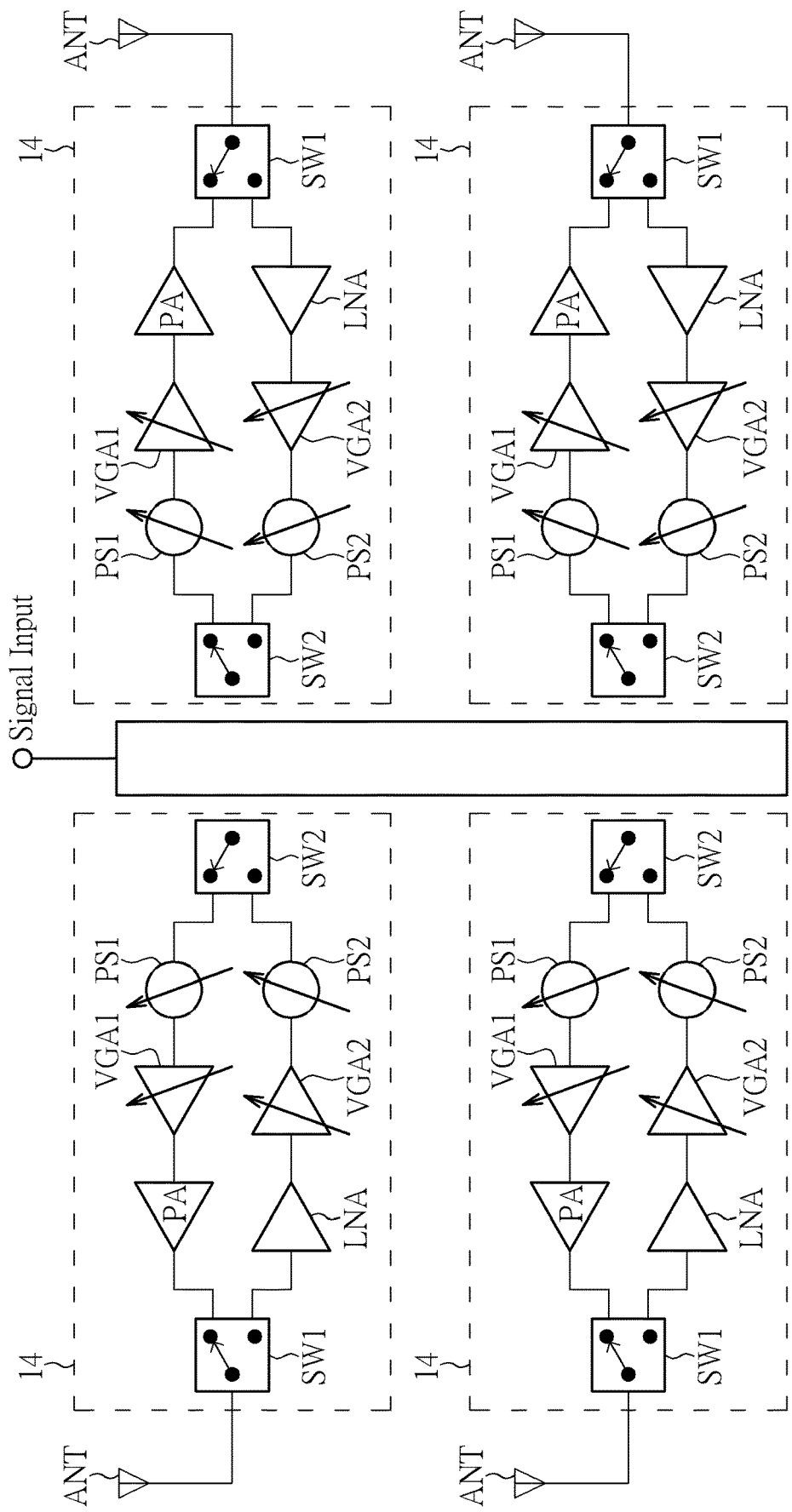
FIG. 2 is a schematic diagram of a plurality of gallium arsenide (GaAs) radio frequency (RF) circuits according to an embodiment of the present application.

FIG. 1 is a schematic diagram of a top view of a millimeter wave front-end module 10 according to an embodiment of the present application. FIG. 2 is a functional block diagram within a GaAs die 12 comprising a plurality of gallium arsenide (GaAs) radio frequency (RF) circuits 14 according to an embodiment of the present application. The millimeter wave front-end module 10 may be applied in a 5G system and operate at an operating frequency as tens gigahertz (e.g., 30 GHz). The millimeter wave front-end module 10 comprises a plurality of antennas ANT and the GaAs die 12. For illustrative purpose, squares illustrated in FIG. 1 represent areas which are occupied by the plurality of antennas ANT and the GaAs die 12. The plurality of GaAs RF circuits 14 is connected to the plurality of antennas ANT, wherein one GaAs RF circuit 14 is connected to one antenna ANT.

In an embodiment, the plurality of antennas ANT may be disposed on a first side of a printed circuit board (PCB, not illustrated in FIG. 1) and the GaAs die 12 may be disposed on a second side opposite to the first side of the PCB, which is not limited thereto.

The plurality of antennas ANT may be half-wavelength spaced, which means that the plurality of antennas ANT may be the half wavelength $\lambda/2$ of (or corresponding to) the operating frequency, the frequency at which the millimeter wave front-end module 10 operates. In other words, a spacing between the plurality of antennas ANT may be less than or equal to the half wavelength $\lambda/2$. For example, the half wavelength $\lambda/2$ of a 30 GHz operating frequency is about 5 millimeter (mm), and the spacing between the plurality of antennas ANT may be less than or equal to 5 mm.

Note that, for the purpose of reducing circuit area or reducing routing/line path length of the millimeter wave front-end module 10, the GaAs die 12 may be disposed between the plurality of antennas ANT. In this case, or in an embodiment, an area of the GaAs die 12 may be limited by the half wavelength λ/2. For example, the area of the GaAs die 12 may be limited by an area of 5×5 mm².

Conventionally, the GaAs die may be either fabricated by a pHEMT (Pseudomorphic High Electron Mobility Transistor) process or an HBT (Heterojunction Bipolar Transistor) process. The GaAs die fabricated by the pHEMT process may have better RF circuit performance (e.g., better isolation or lower insertion loss) over the one (i.e., GaAs die) fabricated by the HBT process. However, an area of the GaAs die fabricated by the pHEMT process is too large to be disposed between the millimeter wave antennas ANT. The conventional GaAs die fabricated by the pHEMT process is not able to be fitted within the area spanned by the half-wavelength, e.g., 5×5 mm². Thereby, a tradeoff better RF circuit performance and circuit area exists.

To achieve a better balance between the RF circuit performance and the circuit area, in the present application, the GaAs die 12 is fabricated by a BiHEMT process, which is a combination of the HBT process and the pHEMT process. Furthermore, within the GaAs die 12, some performance demanding component is fabricated by the pHEMT process and some circuit-area demanding component is fabricated by the HBT process.

In the following description and claims, a component fabricated by the pHEMT process represents that the component comprises pHEMT(s), and a component fabricated by the HBT process represents that the component comprises HBT(s).

Figure 3:
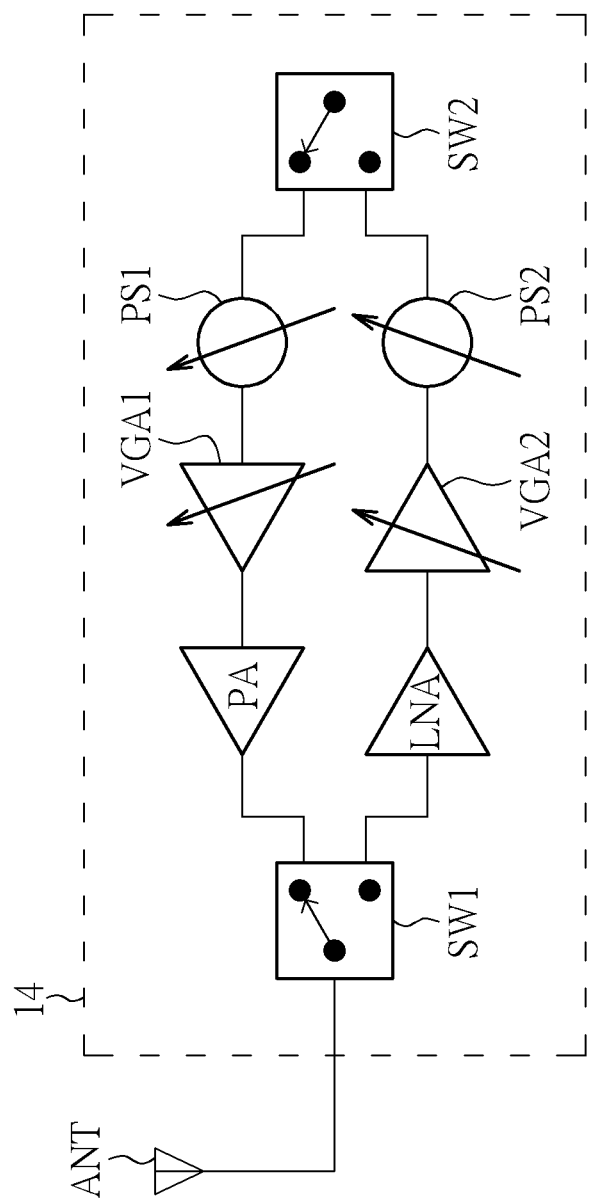
FIG. 3 is a schematic diagram of a GaAs RF circuit according to an embodiment of the present application.

FIG. 3 is a schematic diagram of the GaAs RF circuit 14 according to an embodiment of the present application. The GaAs RF circuit 14 comprises transmit/receive (TR) switches SW1, SW2, a power amplifier PA, a low noise amplifier LNA, active phase shifters PS1, PS2 and variable gain amplifiers VGA1, VGA2.

Different from the GaAs die or the GaAs RF circuit in the art, the TR switches SW1, SW2 are fabricated by the pHEMT process and the active phase shifters PS1, PS2 are fabricated by the HBT process. The power amplifier PA, the low noise amplifier LNA and the variable gain amplifiers VGA1, VGA2 may be fabricated by the pHEMT process or the HBT process, depending on practical design criterion(s).

The rationale of fabricating the TR switches SW1, SW2 by the pHEMT process is that pHEMT has better performance in terms of high isolation and low insertion loss, compared to the TR switches fabricated by the HBT process, such that fabricating the TR switches SW1, SW2 by the pHEMT process would gain better RF circuit performance.

Figure 4:
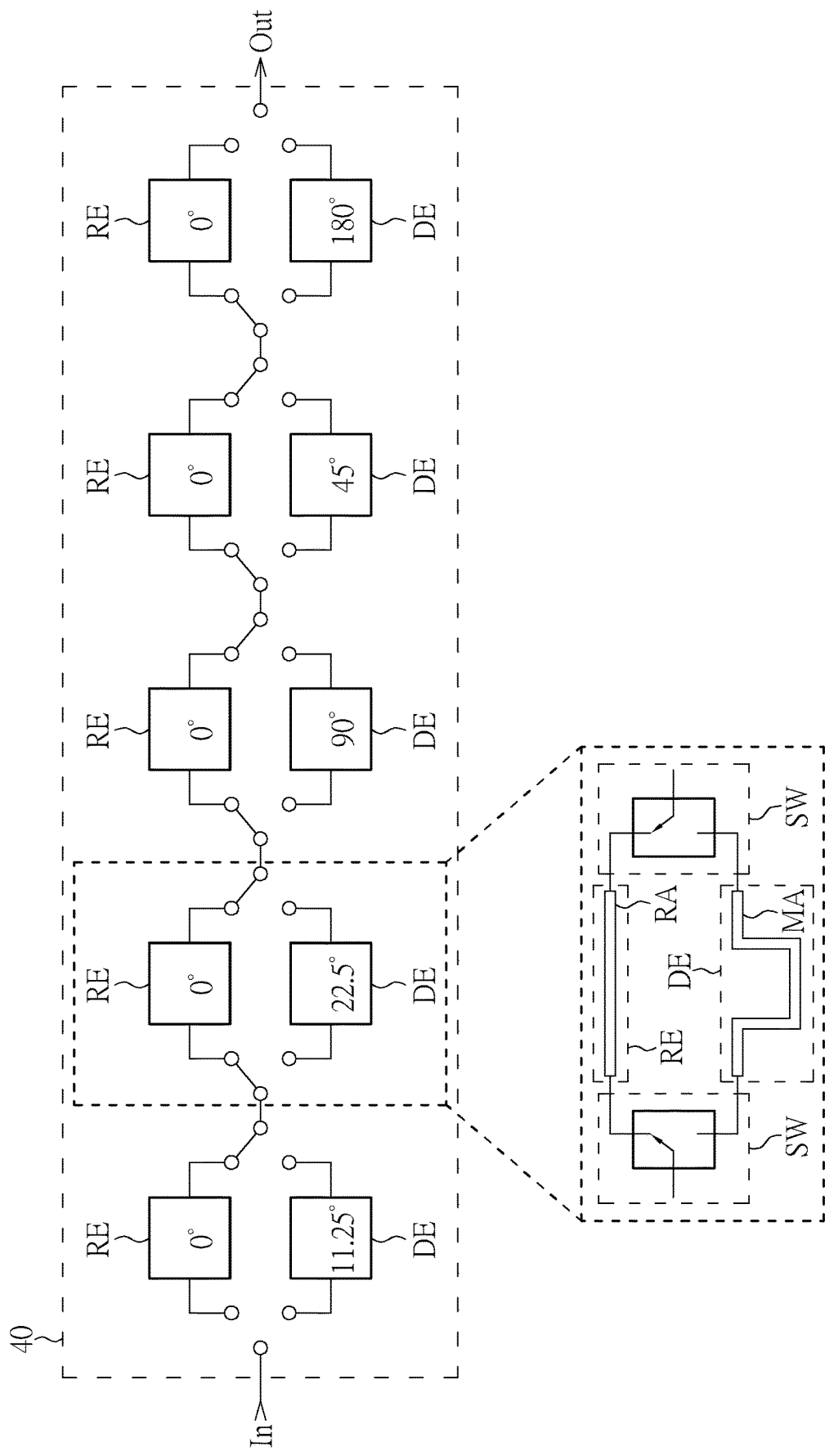
FIG. 4 is a schematic diagram of a passive phase shifter.
Figure 5:
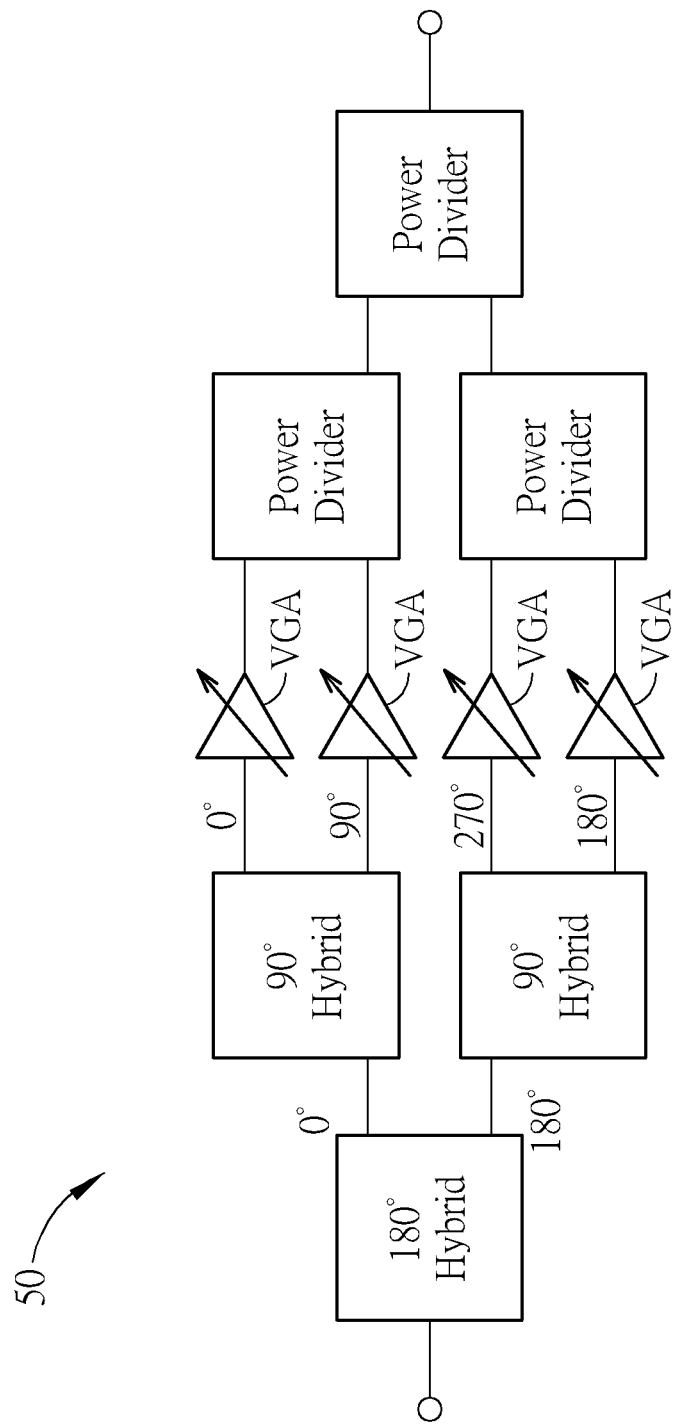
FIG. 5 is a schematic diagram of an active phase shifter according to an embodiment of the present application.

The rationale of utilizing active phase shifter, instead of passive phase shifter, is that the passive phase shifter requires/occupies too much area. To elaborate more, FIG. 4 and FIG. 5 are schematic diagrams of a passive phase shifter 40 and an active phase shifter 50, respectively. The active phase shifter 50, as an embodiment, may be used to realize the active phase shifter PS1/PS2, but not limited thereto.

The passive phase shifter 40 comprises a plurality of switches SW, a plurality of reference elements RE, and a plurality of delay elements DE. The reference elements RE and the delay elements DE may be realized by transmission lines. The reference element RE may comprise a straight arm SA, and the delay element DE may comprise a meandered arm MA, so as to produce a certain phase delay. Note that, the larger the phase delay, the larger the area required/occupied by the delay element DE, which is the reason why the passive phase shifter 40 requires/occupies so much area. On the other hand, even though the active phase shifter 50 comprises a plurality of variable gain amplifiers VGA (which requires circuit area as well), the area of the active phase shifter 50 is less than the passive phase shifter 40. Furthermore, the active phase shifter 50 is fabricated by the HBT process, which means that the variable gain amplifiers within the active phase shifter 50 are realized by HBTs. Note that, the active phase shifter 50 fabricated by the HBT process has smaller area compared to the active phase shifter fabricated by the pHEMT process.

Numerically, a 28 GHz passive phase shifter fabricated by the GaAs pHEMT process requires an area of 3.8×1 mm². An active phase shifter fabricated by the GaAs HBT process requires an area of 1.3×0.4 mm², which is 7.3 times less than the one (area) of the passive phase shifter fabricated by the pHEMT process. Thereby, the area of the active phase shifter fabricated by the HBT process is significantly reduced, compared to the area of the passive phase shifter fabricated by the pHEMT process.

Furthermore, considering a full circuit of the GaAs RF circuit, the GaAs RF circuit (within the same circuit topology as FIG. 3) fabricated by the pHEMT process requires an area of 5.5λ² mm². The GaAs RF circuit 14, as shown in FIG. 3, fabricated by the BiHEMT process (in which the TR switches SW1, SW2, the power amplifier PA, a low noise amplifier LNA are fabricated by the pHEMT process, and the active phase shifters PS1, PS2 and variable gain amplifiers VGA1, VGA2 are fabricated by the HBT process) requires an area of 2×1.2 mm², which is a 4.58 times area reduction. Furthermore, the GaAs RF circuit 14 fabricated by the BiHEMT process stated in the above can be fitted in the size of the GaAs die constrained by the half wavelength of millimeter wave radio system.

Figure 6:
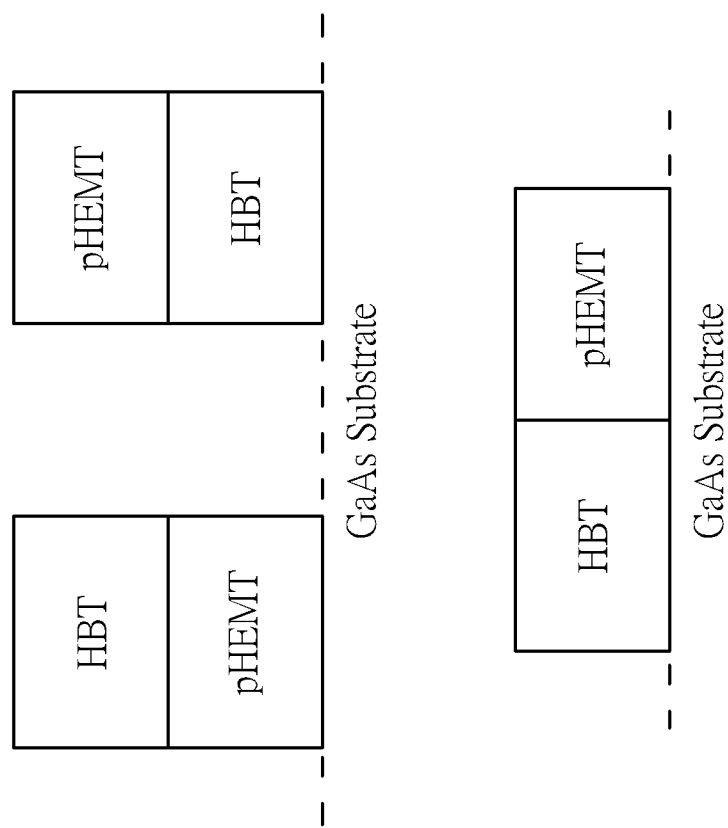
FIG. 6 is a schematic diagram of cross sectional views of a GaAs RF circuit according to an embodiment of the present application.

Notably, the embodiments stated in the above are utilized for illustrating the concept of the present application. Those skilled in the art may make modifications and alterations accordingly, and not limited herein. For example, an arrangement between the pHEMT components and the HBT components within the GaAs die 12 is not limited. The pHEMT components may be disposed on the HBT components, or the HBT components may be disposed on the pHEMT components, like an upper portion of FIG. 6 shows, which is not limited thereto. Alternatively, the HBT components may be disposed by the pHEMT components, like a lower portion of FIG. 6 shows, which is also not limited thereto.

In summary, the instant application fabricates the active phase shifters by the HBT process and fabricates at least the TR switches by the pHEMT process, which can achieve a better balance/tradeoff between RF circuit performance versus circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gallium arsenide (GaAs) radio frequency (RF) circuit, comprising:
    a power amplifier or a low noise amplifier;
    a first transmit/receive (TR) switch, coupled to the power amplifier or the low noise amplifier, wherein the first TR switch is fabricated by a pHEMT (Pseudomorphic High Electron Mobility Transistor) process; and
    a first active phase shifter, coupled to the power amplifier or the low noise amplifier, wherein the first active phase shifter is fabricated by an HBT (Heterojunction Bipolar Transistor) process;
    wherein the GaAs RF circuit is formed within a GaAs die.

2. The GaAs RF circuit of claim 1, wherein the first active phase shifter comprises a plurality of variable gain amplifiers fabricated by the HBT process.

3. The GaAs RF circuit of claim 1, further comprising a first variable gain amplifier, coupled to the power amplifier or the low noise amplifier.

4. The GaAs RF circuit of claim 3, wherein the first variable gain amplifier is fabricated by the HBT process.

5. The GaAs RF circuit of claim 3, further comprising:
a second variable gain amplifier;
wherein the first variable gain amplifier is coupled to the power amplifier and the second variable gain amplifier is coupled to the low noise amplifier.

6. The GaAs RF circuit of claim 1, wherein the power amplifier or the low noise amplifier is fabricated by the pHEMT process.

7. The GaAs RF circuit of claim 1, wherein the power amplifier or the low noise amplifier is fabricated by the HBT process.

8. The GaAs RF circuit of claim 1, further comprising:
a second active phase shifter, coupled to the power amplifier or the low noise amplifier wherein the second active phase shifter is fabricated by the HBT process; and
a second TR switch, coupled to the power amplifier and the low noise amplifier, wherein the second TR switch is fabricated by the pHEMT process.

9. A millimeter wave front-end module, comprising:
a plurality of antennas, wherein a spacing between the plurality of antennas is less than or equal to a half of a wavelength corresponding to an operating frequency at which the millimeter wave front-end module operates; and
a gallium arsenide (GaAs) die, disposed between the plurality of antennas, comprising a plurality of GaAs radio frequency (RF) circuits, each GaAs RF circuit comprising:
a power amplifier or a low noise amplifier;
a first transmit/receive (TR) switch, coupled to the power amplifier or the low noise amplifier, wherein the first TR switch is fabricated by a pHEMT (Pseudomorphic High Electron Mobility Transistor) process; and
a first active phase shifter, coupled to the power amplifier or the low noise amplifier, wherein the first active phase shifter is fabricated by an HBT (Heterojunction Bipolar Transistor) process;
wherein a GaAs RF circuit is coupled to an antenna.

10. The millimeter wave front-end module of claim 9, wherein the first active phase shifter comprises a plurality of variable gain amplifiers fabricated by the HBT process.

11. The millimeter wave front-end module of claim 9, wherein the each GaAs RF circuit further comprises a first variable gain amplifier, coupled to the power amplifier or the low noise amplifier.

12. The millimeter wave front-end module of claim 11, wherein the first variable gain amplifier is fabricated by the HBT process.

13. The millimeter wave front-end module of claim 11, wherein the each GaAs RF circuit further comprises:
a second variable gain amplifier;
wherein the first variable gain amplifier is coupled to the power amplifier and the second variable gain amplifier is coupled to the low noise amplifier.

14. The millimeter wave front-end module of claim 9, wherein the power amplifier or the low noise amplifier is fabricated by the pHEMT process.

15. The millimeter wave front-end module of claim 9, wherein the power amplifier or the low noise amplifier is fabricated by the HBT process.

16. The millimeter wave front-end module of claim 9, wherein the each GaAs RF circuit further comprises:
a second active phase shifter, coupled to the power amplifier or the low noise amplifier wherein the second active phase shifter is fabricated by the HBT process; and
a second TR switch, coupled to the power amplifier and the low noise amplifier, wherein the second TR switch is fabricated by the pHEMT process.

\* \* \* \* \*